US012431172B2

(12) United States Patent
Lee et al.

(10) Patent No.: US 12,431,172 B2
(45) Date of Patent: Sep. 30, 2025

(54) OPERATION METHOD FOR MEMORY DEVICE

(71) Applicant: MACRONIX INTERNATIONAL CO., LTD., Hsinchu (TW)

(72) Inventors: Shih-Chung Lee, Katsuradaiminami (JP); Chi-Yuan Chin, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 221 days.

(21) Appl. No.: 18/168,638

(22) Filed: Feb. 14, 2023

(65) Prior Publication Data

US 2024/0274169 A1     Aug. 15, 2024

(51) Int. Cl.
  *G11C 7/10*     (2006.01)
  *G11C 7/22*     (2006.01)
  *G11C 8/08*     (2006.01)

(52) U.S. Cl.
  CPC .............. *G11C 7/1096* (2013.01); *G11C 7/22* (2013.01); *G11C 8/08* (2013.01)

(58) Field of Classification Search
  CPC ........... G11C 7/1096; G11C 7/22; G11C 8/08; G11C 16/0483; G11C 16/08; G11C 16/10; G11C 16/32; G11C 16/3459; G11C 16/3427
  See application file for complete search history.

(56) References Cited

U.S. PATENT DOCUMENTS

| 10,269,570 | B2 | 4/2019 | Lee |
| 10,741,262 | B2 | 8/2020 | Lin et al. |
| 2013/0242666 | A1* | 9/2013 | Izumi ..................... G11C 16/10 365/185.19 |
| 2020/0388312 | A1 | 12/2020 | Park et al. |
| 2022/0036944 | A1* | 2/2022 | Han ........................ G11C 16/10 |
| 2023/0307069 | A1* | 9/2023 | Joo ..................... G11C 11/5628 |
| 2024/0028217 | A1* | 1/2024 | Park ........................ G11C 7/14 |
| 2024/0079069 | A1* | 3/2024 | Yang ..................... G11C 16/08 |

FOREIGN PATENT DOCUMENTS

| TW | I517164 B | 1/2016 |
| TW | I709135 B | 11/2020 |
| TW | I732068 B | 7/2021 |
| TW | I781830 B | 10/2022 |

* cited by examiner

*Primary Examiner* — Amir Zarabian
*Assistant Examiner* — Bradley S Coon
(74) *Attorney, Agent, or Firm* — McClure, Qualey & Rodack, LLP

(57) ABSTRACT

An operation method for a memory device includes: selecting a selected word line from a plurality of word lines; applying a program voltage to the selected word line; and applying a pass voltage to a plurality of adjacent word lines adjacent to the selected word line. The pass voltage includes a first part and a second part. A timing of the first part of the pass voltage is earlier than a timing of the second part of the pass voltage. A voltage of the first part of the pass voltage is higher than a voltage of the second part of the pass voltage.

11 Claims, 5 Drawing Sheets

OPERATION METHOD FOR MEMORY DEVICE

TECHNICAL FIELD

The disclosure relates in general to an operation method for a memory device.

BACKGROUND

In memory device operations, for example, programming operations, how to improve program efficiency is an important issue. In programming operations, a program voltage (Vpgm) is applied to the selected word line while a pass voltage (VpassP) is applied to adjacent word lines adjacent to the selected word line.

In programming, if the pass voltage (VpassP) applied to adjacent word lines is gradually increased, a better programming efficiency is achieved.

However, accompanying with increase of the pass voltage, the program disturbance may become worse. Thus, in the prior art, a pass voltage limit is set.

After achieving the pass voltage limit, the pass voltage is not allowed to be higher to prevent high possibility of programming disturbance. However, this will also degrade the programming efficiency.

Thus, there needs an operation method for a memory device which may improve program efficiency while prevent high possibility of programming disturbance.

SUMMARY

An operation method for a memory device includes: selecting a selected word line from a plurality of word lines; applying a program voltage to the selected word line; and applying a pass voltage to a plurality of adjacent word lines adjacent to the selected word line. The pass voltage includes a first part and a second part. A timing of the first part of the pass voltage is earlier than a timing of the second part of the pass voltage. A voltage of the first part of the pass voltage is higher than a voltage of the second part of the pass voltage.

Figure 1:
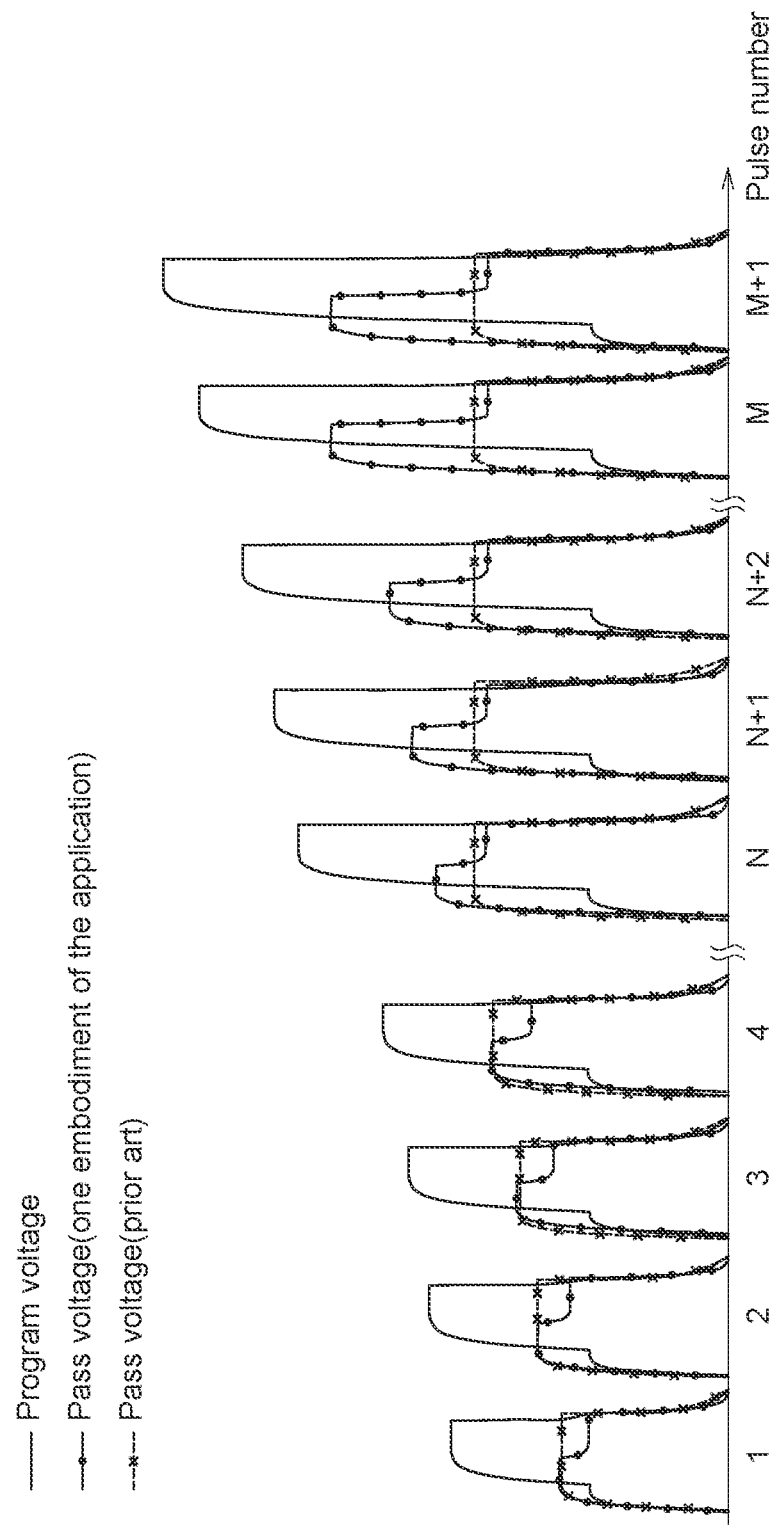
FIG. 1 shows waveforms of program voltages and pass voltages for a memory device of one embodiment of the application and the pass voltages of the prior art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows waveforms of program voltages and pass voltages for a memory device of one embodiment of the application and the pass voltages of the prior art. In FIG. 1, the program voltage is applied to a selected word line while the pass voltage is applied to two adjacent word lines adjacent to the selected word line. In the following, the term "adjacent word line" refers to the word line adjacent to the selected word line.

As shown in FIG. 1, in prior art, the pass voltage applied to the adjacent word lines is gradually increased but after predetermined pulse number (for example, the N-th pulse, N being a positive integer), the pass voltage is fixed in order to prevent program disturbance. However, the program efficiency is not good in the prior art.

As shown in FIG. 1, as for ISPP (Incremental Step Pulse Programming), in one embodiment of the application and in the prior art, the program voltage applied to the selected word line is gradually increased.

As shown in FIG. 1, in one embodiment of the application, the pass voltage applied to the adjacent word lines includes a first part and a second part. The timing of the first part of the pass voltage applied to the adjacent word lines is earlier than the timing of the second part of the pass voltage applied to the adjacent word lines. The voltage of the first part of the pass voltage applied to the adjacent word lines is higher than a voltage of the second part of the pass voltage applied to the adjacent word lines. The voltage of the first part of the pass voltage applied to the adjacent word lines is gradually higher until the pass voltage maximum value. The voltage of the first part of the pass voltage is gradually higher for improving the program speed of the selected word line. In one embodiment of the application, for example but not limited by, the pass voltage maximum value is corresponding to a voltage source value (that is, the pass voltage maximum value is not higher than the voltage source value); and the pass voltage maximum value does not cause program disturbance.

The second part of the pass voltage applied to the adjacent word lines has a voltage lower than the first part of the pass voltage applied to the adjacent word lines. Further, in order to prevent severe program disturbance, in one embodiment of the application, when the voltage of the second part of the pass voltage applied to the adjacent word lines reaches a predetermined voltage, the voltage of the second part of the pass voltage applied to the adjacent word lines is fixed. For example but not limited by, after the N-th pulse, the voltage of the second part of the pass voltage applied to the adjacent word lines is fixed.

As shown in FIG. 1, in one embodiment of the application, by gradually increasing the pass voltage applied to the adjacent word lines, the program efficiency is improved; and by limiting the pass voltage at the pass voltage maximum value, the program disturbance is prevented.

Figure 2:
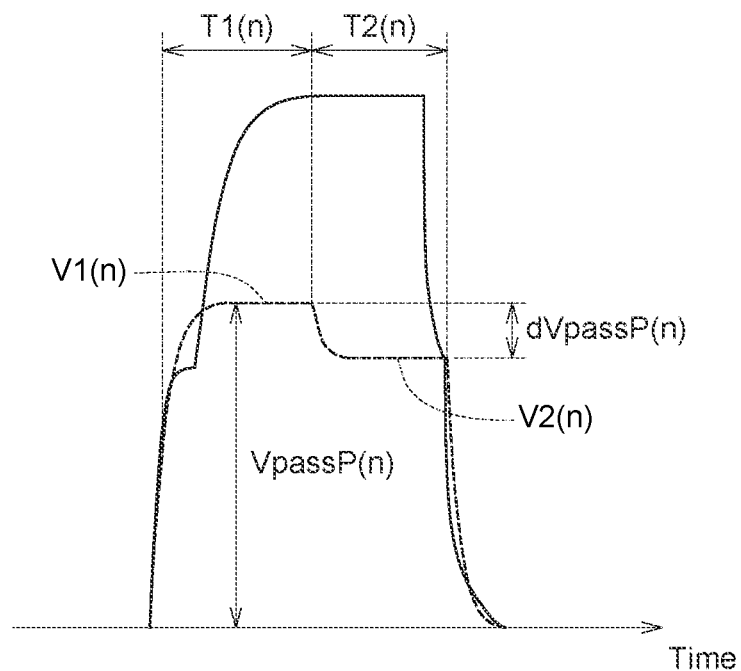
FIG. 2 shows the signal waveforms of the program voltage applied to the selected word line and the pass voltage applied to the adjacent word lines according to one embodiment of the application.

FIG. 2 shows the signal waveforms of the program voltage applied to the selected word line and the pass voltage applied to the adjacent word lines according to one embodiment of the application. In FIG. 2, VpassP(n) refers to the n-th pass voltage, n being a positive integer (in other words, VpassP(n) refers to the pass voltage at n-th shot). T1(n) and T2(n) refer to the first part and the second part of the n-th pass voltage VpassP(n), respectively. The first part T1(n) of the n-th pass voltage VpassP(n) has a width enough for enhancing the tunneling effect. The width of the first part T1(n) of the n-th pass voltage VpassP(n) is variable based on the pulse number n.

The second part T2(n) of the n-th pass voltage VpassP(n) is lower for preventing program disturbance. In FIG. 2, dVpassP(n) refers to a voltage difference value between a voltage V1(n) of the first part T1(n) of the n-th pass voltage VpassP(n) and a voltage V2(n) of the second part T2(n) of the n-th pass voltage VpassP(n), i.e. dVpassP(n)=V1(n)–V2(n). dVpassP(n) also refers as a voltage drop of the n-th pass voltage VpassP(n). The voltage drop dVpassP(n) of the n-th pass voltage VpassP(n) is also a variable, which is varied based on the pulse number "n".

Figure 3:
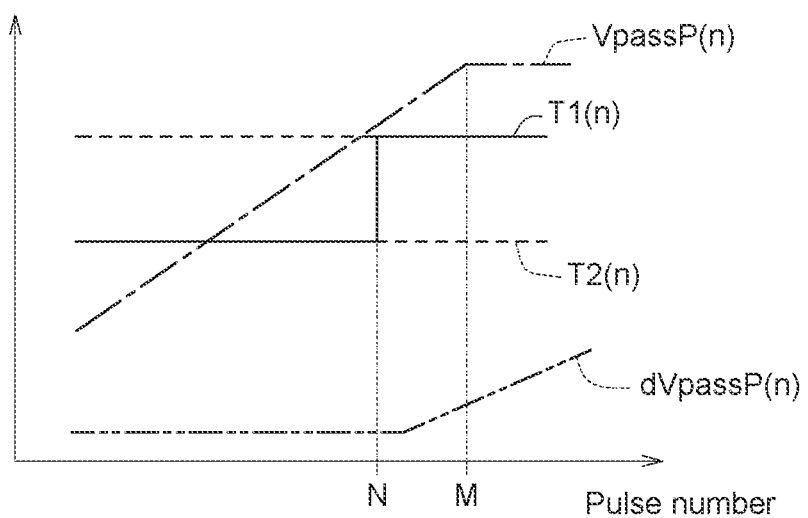
FIG. 3 shows the pass voltage according to one embodiment of the application.

FIG. 3 shows the pass voltage according to one embodiment of the application. The total width of the first part T1(n) and the second part T2(n) of the n-th pass voltage VpassP(n) is fixed, and thus the pulse width of the pass voltage VpassP(n) is also fixed. Further, before a first predetermined pulse number (for example but not limited by, the number "N" in FIG. 1), the width of the first part T1(n) of the n-th pass voltage VpassP(n) is shorter than the width of the second part T2(n) of the n-th pass voltage VpassP(n). After the first predetermined pulse number, the width of the first part T1(n) of the n-th pass voltage VpassP(n) is longer than the width of the second part T2(n) of the n-th pass voltage VpassP(n). By so, the programming speed under high threshold voltage states is improved. That is, the width of the first part T1(n) of the n-th pass voltage VpassP(n) is variable based on the pulse number "n" while the width of the second part T2(n) of the n-th pass voltage VpassP(n) is also variable based on the pulse number "n".

Further, as shown in FIG. 1 and FIG. 3, before the first predetermined pulse number (for example but not limited by, "N" in FIG. 1), the voltage drop dVpassP(n) of the n-th pass voltage VpassP(n) is fixed, but after the first predetermined pulse number (for example but not limited by, "N" in FIG. 1), the voltage drop dVpassP(n) of the n-th pass voltage VpassP(n) is gradually larger. This is because, the voltage of the first part of the pass voltage is gradually higher until the pass voltage maximum value but after N-th pulse, the voltage of the second part of the pass voltage is fixed. Thus, after N-th pulse, the voltage drop dVpassP(n) of the n-th pass voltage VpassP(n) is gradually larger.

As shown in FIG. 1 and FIG. 3, before the second predetermined pulse number (for example but not limited by, "M" in FIG. 1), the voltage of the pass voltage VpassP(n) (or said, the voltage of the first part of the pass voltage VpassP(n)) is gradually increased to enhance program speed. After the second predetermined pulse number (for example but not limited by, "M" in FIG. 1), the voltage of the pass voltage VpassP(n) (or said, the voltage of the first part of the pass voltage VpassP(n)) is fixed to prevent program disturbance.

Figure 4:
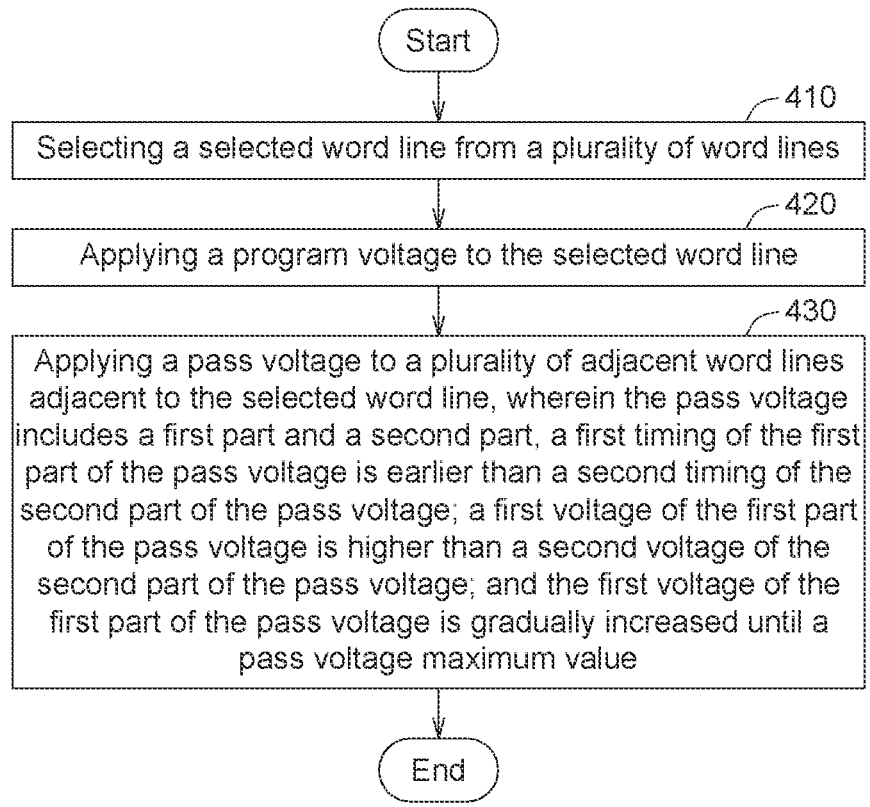
FIG. 4 shows an operation method for a memory device according to one embodiment of the application.

FIG. 4 shows an operation method for a memory device according to one embodiment of the application. The operation method for the memory device according to one embodiment of the application includes: (410) selecting a selected word line from a plurality of word lines; (420) applying a program voltage to the selected word line; and (430) applying a pass voltage to a plurality of adjacent word lines adjacent to the selected word line, wherein the pass voltage includes a first part and a second part, a first timing of the first part of the pass voltage is earlier than a second timing of the second part of the pass voltage; a first voltage of the first part of the pass voltage is higher than a second voltage of the second part of the pass voltage; and the first voltage of the first part of the pass voltage is gradually increased until a pass voltage maximum value.

Figure 5:
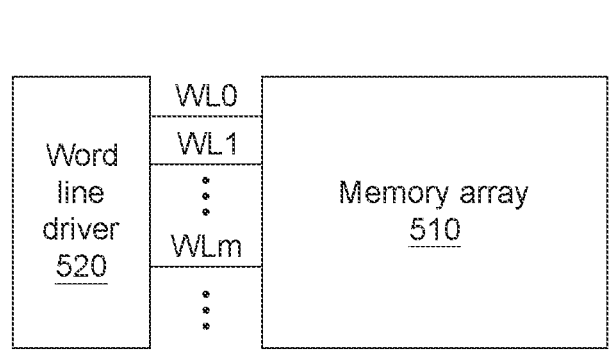
FIG. 5 shows a functional block diagram of a memory device according to one embodiment of the application.

FIG. 5 shows a functional block diagram of a memory device according to one embodiment of the application. As shown in FIG. 5, the memory device 500 according to one embodiment of the application includes: a memory array 510, a word line driver 520 and a plurality of word lines WL0~WLm (m being a positive integer. The memory array 510 includes a plurality of memory cells. The word line driver 520 are coupled to the word line driver 520 via the word lines WL0~WLm. The word line driver 520 applies a program voltage Vpgm to a selected word line of the word lines WL0~WLm, and the word line 620 applies a pass voltage VpassP to a plurality of adjacent word lines adjacent to the selected word line.

Figure 6:
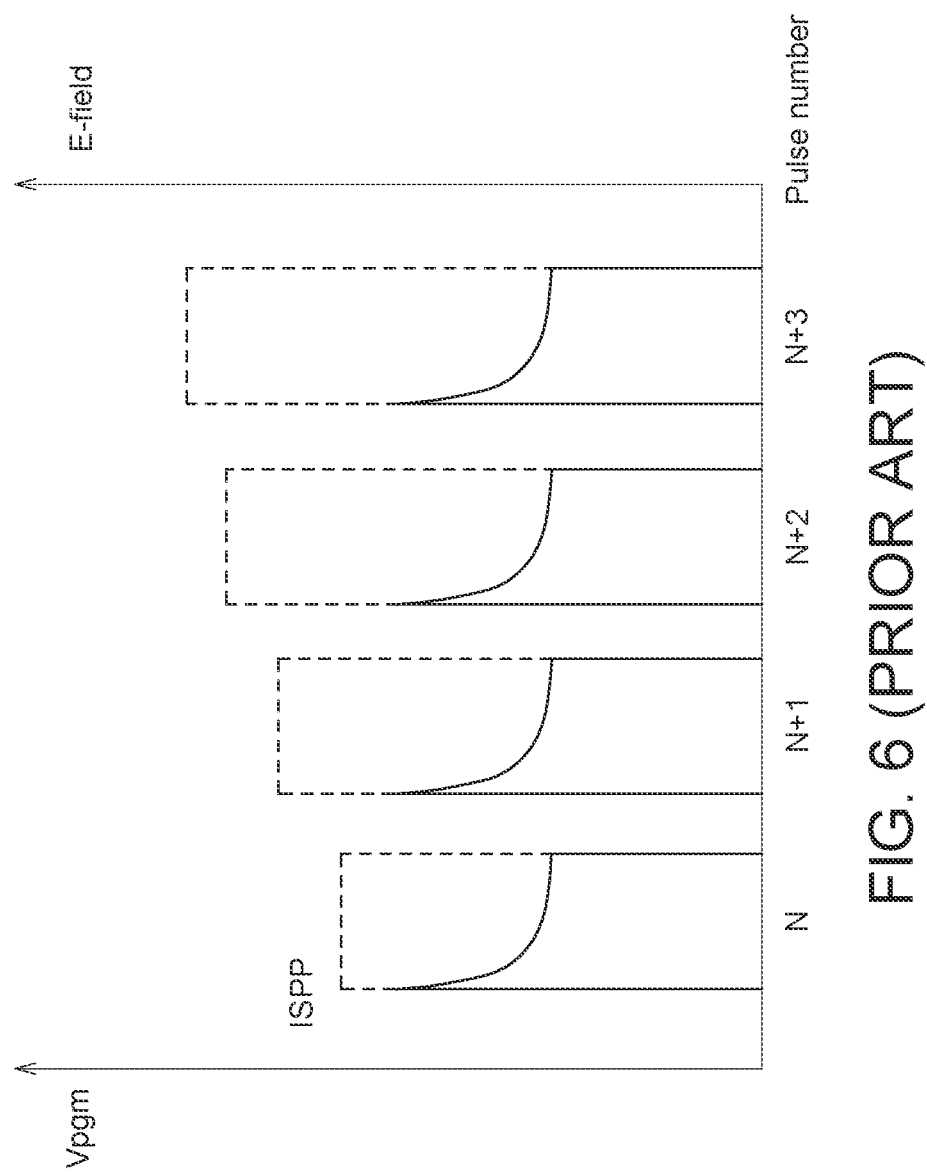
FIG. 6 shows a prior art FN (Fowler-Nordheim) tunneling mode.

FIG. 6 shows a prior art FN(Fowler-Nordheim) tunneling mode. In the FN tunneling mode, earlier pulses have strong electrical field and thus high electronic tunneling effects; and middle or late pulses have weak and saturated electric field, and thus weak electronic tunneling effects. Thus, the prior art has worse programming efficiency.

In one embodiment of the application, at the earlier programming pulses, the pass voltage is gradually increased to enhance Fowler-Nordheim (FN) tunneling effect for improving the program efficiency.

One embodiment of the application is applicable in for example but not limited by, floating gate memories, charge trapping memories, non-volatile memories and embedded memories.

In one embodiment of the application, by gradually increasing the pass voltage until the pass voltage maximum value, the program efficiency is improved and the program disturbance is effectively prevented.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method for a memory device, the operation method including:

selecting a selected word line from a plurality of word lines;

applying a program voltage to the selected word line; and applying a pass voltage to a plurality of adjacent word lines adjacent to the selected word line, wherein the pass voltage includes a first part and a second part, a timing of the first part of the pass voltage is earlier than a timing of the second part of the pass voltage; and a voltage of the first part of the pass voltage is higher than a voltage of the second part of the pass voltage, wherein the voltage of the first part of the pass voltage is gradually increased until the pass voltage reaches a pass voltage maximum value, and the voltage of the second part of the pass voltage is gradually increased, wherein after a first predetermined pulse number or reaching a predetermined voltage, the voltage of the second part of the pass voltage is fixed.

2. The method according to claim 1, wherein a width of the first part of the pass voltage is variable based on a pulse number.

3. The method according to claim 1, wherein a width of the second part of the pass voltage is variable based on a pulse number.

4. The method according to claim 2, wherein
before the first predetermined pulse number, the width of the first part of the pass voltage is shorter than a width of the second part of the pass voltage.

5. The method according to claim 3, wherein
before the first predetermined pulse number, a width of the first part of the pass voltage is shorter than the width of the second part of the pass voltage.

6. The method according to claim 2, wherein
after the first predetermined pulse number, the width of the first part of the pass voltage is longer than a width of the second part of the pass voltage.

7. The method according to claim 3, wherein
after the first predetermined pulse number, a width of the first part of the pass voltage is longer than the width of the second part of the pass voltage.

8. The method according to claim 1, wherein a voltage drop of the pass voltage is variable based on a pulse number, the voltage drop of the pass voltage indicating a voltage difference between the voltage of the first part of the pass voltage and the voltage of the second part of the pass voltage.

9. The method according to claim 8, wherein
before the first predetermined pulse number, the voltage drop of the pass voltage is fixed; and
after the first predetermined pulse number, the voltage drop of the pass voltage is gradually higher.

10. The method according to claim 1, wherein
before a second predetermined pulse number, the voltage of the first part of the pass voltage is gradually higher; and
after the second predetermined pulse number, the voltage of the first part of the pass voltage reaches the pass voltage maximum value.

11. The method according to claim 1, wherein the maximum value of the pass voltage is corresponding to a voltage source.

* * * * *